(12) United States Patent
Bernardon et al.

(10) Patent No.: US 7,898,268 B2
(45) Date of Patent: Mar. 1, 2011

(54) CIRCUIT AND METHOD FOR CAPACITOR EFFECTIVE SERIES RESISTANCE MEASUREMENT

(75) Inventors: Derek Bernardon, Villach (AT); Dieter Haerle, Villach (AT)

(73) Assignee: Infineon Technologies AG, Neubiberg (DE)

( * ) Notice: Subject to any disclaimer, the term of this patent is extended or adjusted under 35 U.S.C. 154(b) by 341 days.

(21) Appl. No.: 12/032,260

(22) Filed: Feb. 15, 2008

(65) Prior Publication Data

US 2009/0206854 A1    Aug. 20, 2009

(51) Int. Cl.
*G01R 27/08* (2006.01)

(52) U.S. Cl. .................. 324/713; 324/678; 324/659; 324/548

(58) Field of Classification Search ............... 324/713
See application file for complete search history.

(56) References Cited

U.S. PATENT DOCUMENTS

| | | | |
|---|---|---|---|
| 4,216,424 A * | 8/1980 | Vette | 324/659 |
| 7,148,697 B2 * | 12/2006 | Doljack | 324/548 |
| 2005/0270042 A1 * | 12/2005 | Doljack | 324/686 |
| 2007/0030016 A1 * | 2/2007 | Schumacher et al. | 324/678 |
| 2007/0115006 A1 * | 5/2007 | Anude et al. | 324/678 |
| 2008/0204049 A1 * | 8/2008 | Kawate et al. | 324/679 |

OTHER PUBLICATIONS

SLVA061 "Understanding Boost Power Stages in Switchmode Power Supplies", Application Report (Texas Instruments) Mar. 1999, pp. 1-28.

* cited by examiner

*Primary Examiner*—Timothy J Dole
*Assistant Examiner*—Benjamin M Baldridge
(74) *Attorney, Agent, or Firm*—Dicke, Billig & Czaja, PLLC

(57) ABSTRACT

A circuit and method for capacitor effective series resistance measurement. One embodiment provides a method for measuring the effective series resistance of a capacitor having a capacitor voltage. The method includes amplifying the capacitor voltage with an AC coupled amplifier yielding a first amplified signal. The capacitor is discharged with a constant current for a measurement time thus causing a voltage swing of the capacitor voltage due to a voltage drop across the effective series resistance. The capacitor voltage is amplified with the AC coupled amplifier yielding a second amplified signal being dependent on the voltage swing. The effective series resistance is calculated from the first and the second amplified signals.

16 Claims, 3 Drawing Sheets

CIRCUIT AND METHOD FOR CAPACITOR EFFECTIVE SERIES RESISTANCE MEASUREMENT

BACKGROUND

The invention relates to systems and circuits including measurement of parameters of electronic components, especially to measurement of the effective series resistance of a capacitor.

In many applications information about the effective series resistance of a capacitor is necessary to provide robust function. So called "energy reserve capacitors" are often employed to provide an autonomous power supply, especially in security-relevant automotive applications such as, for example, airbag control systems, where energy reserve capacitors play a vital role in the case the battery is disconnected. Furthermore, in some systems the power for firing the squibs in order to deploy the airbags comes exclusively from the energy reserve capacitor. Since the current consumption may be 2 A or more, a significant voltage drop may be generated across the effective series resistance of the energy reserve capacitor. This voltage drop may have a negative impact on the robustness and the functionality of the respective integrated circuit.

To allow for adequate provisions to avoid the negative effects of the voltage drop across the effective series resistance of the capacitor, a measurement of the effective resistance may be necessary. For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
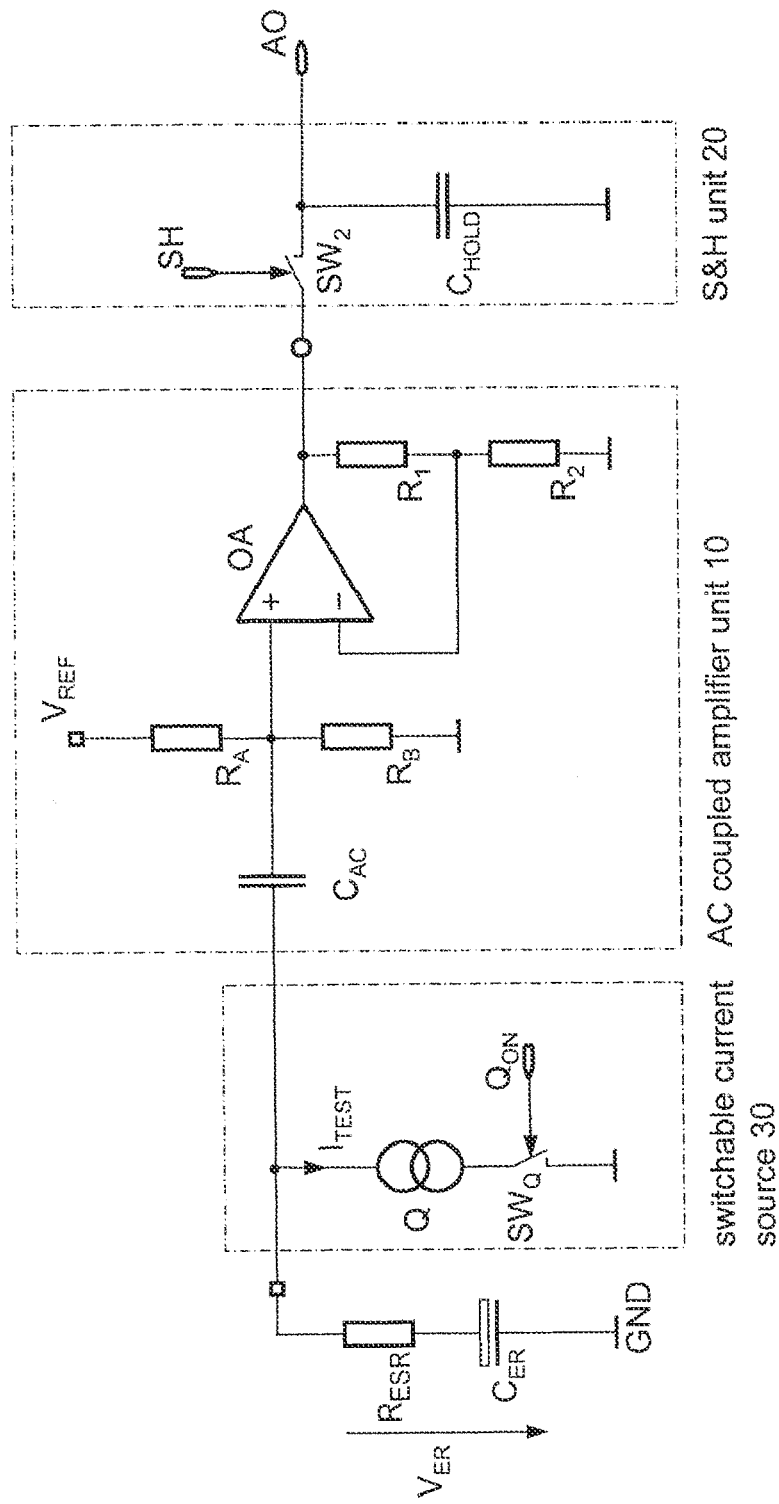
FIG. 1 illustrates as one embodiment a circuit arrangement for measuring the effective series resistance of a capacitor.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One or more embodiments provide an adequate method and an adequate circuit arrangement for measuring the effective series resistance of a capacitor. According to one embodiment, a method for measuring the effective series resistance of a capacitor includes:

amplifying the capacitor voltage with an AC coupled amplifier yielding a first amplified signal; discharging the capacitor with a constant current for a measurement time thus reducing the capacitor voltage due to a voltage drop across the effective series resistance; amplifying the capacitor voltage with the AC coupled amplifier yielding a second measurement value being dependent on the constant current and the effective series resistance; calculating the effective series resistance from the first and the second measurement value.

According to another embodiment, the method may include: deactivating switching converters connected to the energy reserve capacitor for a first time period; amplifying the energy reserve capacitor voltage with an AC coupled amplifier, an output of the amplifier being connected to a hold capacitor via a first switch that is closed during amplifying; opening the first switch after a settling time of the amplifier thus storing the amplified energy reserve capacitor voltage in the hold capacitor as a first measuring value; digitizing the first measurement value; activating a current source connected to the energy reserve capacitor thus discharging the energy reserve capacitor with a constant current and reducing the energy reserve capacitor voltage due to a voltage drop across the effective series resistance; closing the first switch thus connecting the hold capacitor to the amplifier output; deactivating switching converters connected to the energy reserve capacitor for a second time period; amplifying the energy reserve capacitor voltage with the AC coupled amplifier; deactivating the current source; opening the first switch after a settling time of the amplifier thus storing the amplified energy reserve capacitor voltage in the hold capacitor as a second measuring value; digitizing the second measurement value; and calculating the effective series resistance of the energy reserve capacitor from the first and the second digitized measurement value.

A further embodiment provides a circuit arrangement for measuring the effective series resistance of an energy reserve capacitor having an energy reserve capacitor voltage. The circuit arrangement includes: an energy reserve capacitor having an effective series resistance; an amplifier having an amplifier input and an amplifier output, the amplifier input being coupled to the energy reserve capacitor via a coupling capacitor for amplifying an AC portion of the energy reserve capacitor voltage; a sample and hold circuit including a hold capacitor coupled to the amplifier output via a first switch; and a switchable current source coupled to the energy reserve capacitor to discharge the energy reserve capacitor when active; an analog-to-digital converter coupled to the hold capacitor to digitize the voltage of the hold capacitor; and a control unit being configured to trigger the sample and hold circuit, the current source, and the analog-to-digital converter such that a first sample of the amplified AC portion of the energy reserve capacitor voltage is acquired while the current source is inactive and a second sample of the amplified AC portion of the energy reserve capacitor voltage is acquired while the current source is active.

FIG. 1 illustrates as one embodiment of a circuit arrangement configured for measuring the effective series resistance $R_{ESR}$ of a capacitor $C_{ER}$. The energy reserve capacitor $C_{ER}$ may be configured to operate as a power supply for any further circuit (not shown). The effective series resistance $R_{ESR}$ is not an extra resistor but an intrinsic effective resistance of the energy reserve capacitor $C_{ER}$. The energy reserve capacitor $C_{ER}$ may be a separate component whereas the rest of the circuit arrangement of FIG. 1 may be integrated as a single ASIC.

A first terminal of the capacitor $C_{ER}$ is connected to a reference potential terminal, for example, to a ground terminal GND. A second terminal of the capacitor $C_{ER}$ is connected to an AC coupled amplifier unit 10 and to a switchable current source 30 including a current source Q and a switch $SW_Q$ connected in series to the current source. The capacitor voltage $V_{ER}$ is provided at the second terminal of the capacitor $C_{ER}$ and is typically between 20 V and 35 V. Since this is much higher than the supply voltage of e.g., 5 V used for the electronic circuitry, switching converters (not shown) are also connected to the energy reserve capacitor $C_{ER}$ in order to provide an effective DC-DC conversion of the capacitor voltage $V_{ER}$. The AC coupling of the amplifier unit 10 is provided by a coupling capacitor $C_{AC}$ at the input of the amplifier unit 10. The output of the amplifier unit 10 is connected to a sample and hold circuit including a hold capacitor $C_{HOLD}$ connected to the amplifier output via a first switch $SW_1$. The amplifier unit 20 may include an operational amplifier OA whose non-inverting input, in the present embodiment, is biased with a reference voltage $V_{REF}$ via the voltage divider formed by the resistors $R_A$ and $R_B$. The biasing may be useful when using an unipolar supply. The voltage divider $R_A$, $R_B$ and the coupling capacitor $C_{AC}$ form a high-pass filter at the amplifier input in order to prevent the DC portion of the amplifier input signal from being amplified. The operational amplifier circuit is a standard non-inverting amplifier circuit whose gain depends on the design of the feedback resistors $R_1$ and $R_2$.

The voltage $V_{ER}$ across the energy reserve capacitor $C_{ER}$ and its intrinsic effective series resistance $R_{ESR}$ while discharging the capacitor $C_{ER}$ with a constant current I is given by:

$$V_{ER}(t) = Q_0/C_{ER} - I \cdot t/C_{ER} - R_{ESR} \cdot I, \quad (1)$$

where $Q_0$ is the charge stored in the capacitor $C_{ER}$ at a time $t=0$ just before starting discharging the capacitor $C_{ER}$ with a constant current I at a time $t=0$. The first term $Q_0/C_{ER}$ in eqn. (1) represents the initial voltage of the capacitor $C_{ER}$ at a time $t=0$, the second term $I \cdot t/C_{ER}$ in eqn. (1) represents the reduction of the capacitor voltage $V_{ER}$ due to the discharging of the capacitor $C_{ER}$, and the third term $R_{ESR} \cdot I$ of eqn. (1) represents the voltage drop on the intrinsic effective series resistance $R_{ESR}$ of the capacitor $C_{ER}$ which reduces the "visible" voltage $V_{ER}$ across the terminals of the capacitor $C_{ER}$.

The effective series resistance $R_{ESR}$ may be determined from the third term in eqn. (1). This term $R_{ESR} \cdot I$ is equal to the change $\Delta V_{ER}$ of the energy reserve capacitor voltage $V_{ER}$ when starting discharging the capacitor $C_{ER}$. Immediately after starting to discharge the capacitor $C_{ER}$ the voltage change $I \cdot t/C_{ER}$ (cf. eqn. (1)) due to draining charge from the capacitor $C_{ER}$ is negligible and the only relevant parameters determining the voltage change $\Delta V_{ER}$ are the discharging current I and the effective series resistance $R_{ESR}$. If this voltage change would be accessible to measurement the effective series measurement could easily be calculated from the voltage change $\Delta V_{ER}$.

Figure 2:
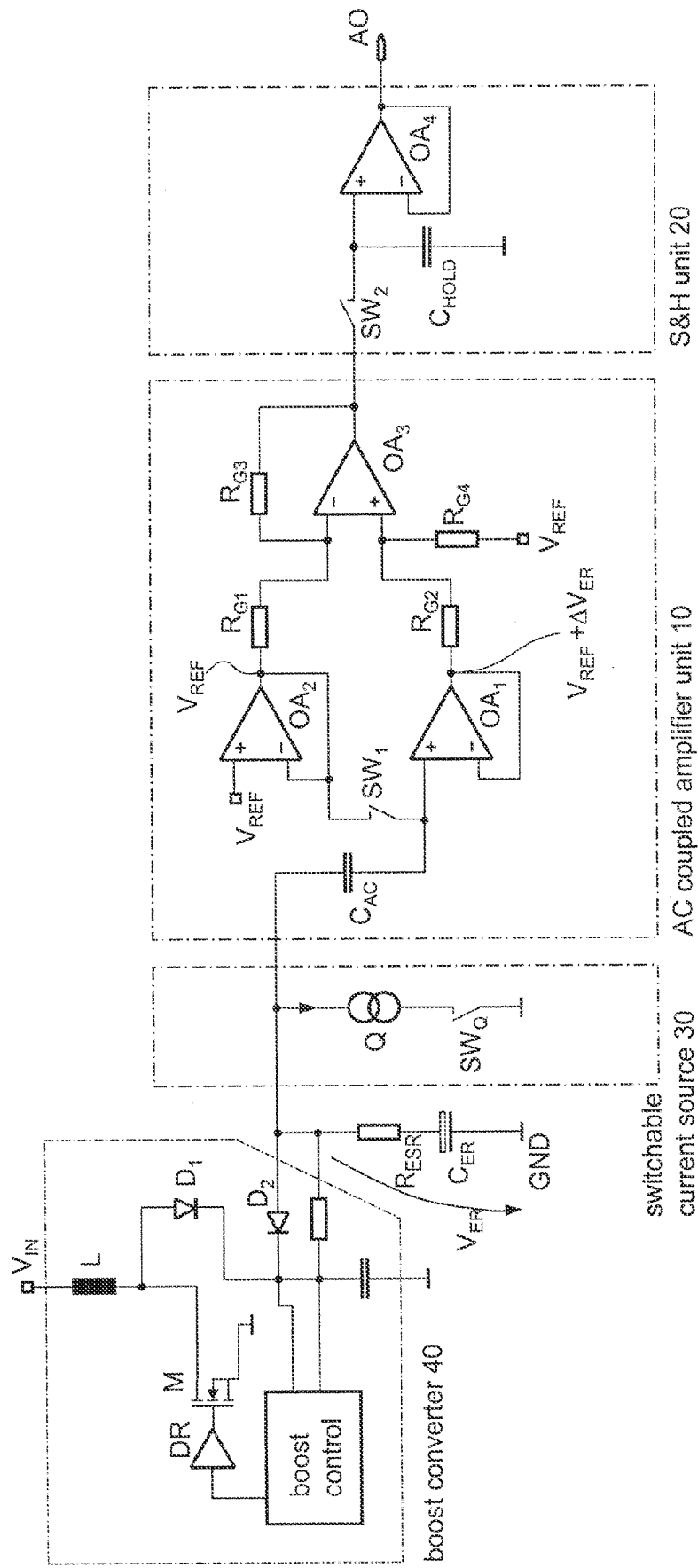
FIG. 2 illustrates as more detailed embodiment another circuit arrangement for measuring the effective series resistance of a capacitor.

Such a measurement of the voltage change $\Delta V_{ER} \approx R_{ESR} \cdot I$ is rendered possible by the circuit arrangements of FIG. 1 and FIG. 2. The AC coupled amplifier 10 for amplifying an AC portion of the capacitor voltage $V_{ER}$, that is in essence the voltage change $\Delta V_{ER}$ when activating the current source 30 for sinking a current I from the energy reserve capacitor $C_{ER}$. The current I discharging the capacitor is in the order of 0.1 A, i.e. it may range, for example, from 50 mA to 200 mA, the capacitance of the energy reserve capacitor $C_{ER}$ may range, for example, from 1000 μF to 20000 μF. The effective series resistance $R_{ESR}$ may range, for example, from 0.05 ohms to 0.5 ohms. For values greater than 0.5 ohms the energy reserve capacitor $C_{ER}$ is considered to be no longer in a good condition.

In one embodiment, the measurement of $\Delta V_{ER}$ should be performed immediately after activating the current source Q by closing switch $SW_Q$ in order to prevent a substantial discharging of the energy reserve capacitor $C_{ER}$. In practice the measurement time period $t_M$ during which the energy reserve capacitor $C_{ER}$ is discharged should be kept as short as possible. The minimum measurement time $t_M$ is at least the settling time $t_S$ after which the transients at the amplifier output due to the switching on of the current source Q have decayed. The maximum measurement time is limited by the desired maximum acceptable measurement error.

After the measurement time has elapsed the output signal (i.e. the amplified voltage change $\Delta V_{ER}$ of the energy reserve capacitor voltage $V_{ER}$) of the amplifier unit 10 is stored in the sample and hold unit 20 immediately before the current source Q is deactivated. The switchable current source 30 (Q, $SW_Q$) is thus only active for a very short time period $t_M$ which is at least as long as the settling time $t_S$ of the amplifier output. The charge drained from the energy reserve capacitor $C_{ER}$ during that time equals $I \cdot t_M$ which is negligible compared to the total charge stored in capacitor $C_{ER}$.

An analog-to-digital converter ADC (not illustrated) may be connected to the output AO of the sample and hold unit 20. The amplified voltage swing $\Delta V_{ER}$ of the energy reserve capacitor voltage $V_{ER}$ due to the voltage drop across the intrinsic effective series resistance $R_{ESR}$ may thus be digitised after being stored in the sample and hold unit 20. A sample and hold unit 20 may be omitted. In this case the measurement time $t_M$ is extended by the conversion time of the ADC. However, the use of the sample and hold unit allows, for example, a low-pass filter, which may be connected upstream to the ADC, to reach steady state before analog to digital conversion.

The ADC may be part of a micro-controller (not shown) which reads out digital measurement values from the ADC and performs the calculations necessary for determining the sought effective series resistance $R_{ESR}$ of the energy reserve capacitor $C_{ER}$. In order to compensate for offsets (e.g., amplifier offset, intentional DC bias) two subsequent measurements may be performed. A first measurement value is acquired with the switchable current source 30 being inactive and a second measurement value is acquired with the switchable current source 30 being active. The first measurement value only (discharging current I=0) depends on the amplifier offset, the second measurement value (discharging current I>0) additionally depends on the voltage drop across the effective series resistance $R_{ESR}$. The offset may be cancelled out when taking the difference between the first and the second measurement value for calculating the effective series resistance.

One embodiment of the measurement method includes:

(A) Amplifying the capacitor voltage $V_{ER}$ with an AC coupled amplifier 10 yielding a first amplified signal. This first amplified signal mainly depends on the offsets present in the amplifier unit 20.

(B) Discharging the capacitor $C_{ER}$ with a constant current I for a measurement time period $t_M$, thus causing a voltage swing $\Delta V_{ER}$ of the capacitor voltage $V_{ER}$ due to a voltage drop $R_{ESR} \cdot I$ across the effective series resistance $R_{ESR}$.

(C) Amplifying the capacitor voltage $V_{ER}$ with the AC coupled amplifier 10 yielding a second amplified signal being dependent on the voltage swing $\Delta V_{ER}$. The above mentioned offsets are also present in the second amplified signal.

(D) Calculating the effective series resistance from the first and the second amplified signal. In order to compensate for the offsets, the difference between the first and the second amplified signal may be used for calculating the effective series resistance $R_{ESR}$.

As mentioned above, the first and the second amplified signal may be stored a sample and hold unit 20 after the measurement time $t_M$ has elapsed and subsequently digitised with an ADC. The calculations may be performed digitally in a microprocessor core. The ADC may be part of a control unit (not shown) including the ADC and the microprocessor core. The control of the switchable current source 30 providing the discharging current I and the sample and hold unit 20 may also be provided by the control unit. Further, more detailed embodiments of the method are later discussed with reference to FIG. 3.

FIG. 2 illustrates another embodiment of the circuit arrangement in more detail. Compared to the embodiment of FIG. 1 the embodiment of FIG. 2 provides a more sophisticated amplifier unit 20. Furthermore switching converters 40 that are also connected to the energy reserve capacitor $C_{ER}$ are considered in the present embodiment. Apart from the additional switching converter 40 the structure of the circuit of FIG. 2 corresponds to the structure of the circuit of FIG. 1.

In the present embodiment the amplifier unit 20 is a biased instrumentation amplifier including three operational amplifiers $OA_1$, $OA_2$, and $OA_3$, wherein operational amplifiers OA1 and OA2 operate as buffer amplifiers with a unity gain and operational amplifier OA3 operates as a differential amplifier being biased by a reference voltage $V_{REF}$.

The input of the amplifier unit 10 is formed by a first terminal of the coupling capacitor $C_{AC}$ which is connected to the energy reserve capacitor $C_{ER}$. A second terminal of the coupling capacitor $C_{AC}$ is connected to the non-inverting input of buffer amplifier $OA_1$. Buffer amplifier $OA_2$ receives the reference voltage $V_{REF}$ at its non-inverting input. The output of buffer amplifier $OA_2$ is connected to the non-inverting input of buffer amplifier $OA_1$ (and thus to the second terminal of coupling capacitor $C_{AC}$) via a switch $SW_1$. The coupling capacitor $C_{AC}$ may be precharged via switch $SW_1$ in order to provide an equal reference potential $V_{REF}$ at the inputs of both amplifiers $OA_1$ and $OA_2$. Assuming the coupling capacitor $C_{AC}$ is precharged and the switch $SW_1$ is open the output voltage of the buffer amplifier $OA_1$ equals $V_{REF} + \Delta V_{ER}$, that is, only the voltage swing $\Delta V_{ER}$ of the energy reserve capacitor voltage $V_{ER}$ is superposed with the reference potential $V_{REF}$ due to the AC coupling of the input of the amplifier unit 10. The outputs of the buffer amplifiers $OA_1$ and $OA_2$ provide input signals for the differential amplifier including the operational amplifier $OA_3$ and resistors $R_{G1}$, $R_{G2}$, $R_{G3}$ and $R_{G4}$ connected to the operational amplifier in order to operate as a differential amplifier. The resistors are designed to provide a differential gain of about 10 with a bias voltage $V_{REF}$ at the output of the operational amplifier $OA_3$ which is also the output of the amplifier unit 10.

As in the previous embodiment of FIG. 1 the output of the amplifier unit 10 is connected to a sample and hold unit 20 including a switch $SW_2$ and a hold capacitor $C_{HOLD}$ which is connected to the output of the amplifier unit 10 via switch $SW_2$. The output voltage of the amplifier unit 10 can be stored in the hold capacitor $C_{HOLD}$. The stored output voltage of the hold capacitor $C_{HOLD}$ may be buffered by a further buffer amplifier $OA_4$ whose output AO may be connected to an analogue-to-digital converter ADC (not shown) for digitizing the stored output voltage of the amplifier unit 10.

The energy reserve capacitor is also connected to a boost converter 40 which is configured to keep the energy reserve capacitor charged when connected to an external power supply potential $V_{IN}$ which may, for example, be provided by the on-board battery of a vehicle. During the measurement time $t_M$ it may be useful to turn off all switching converters which are connected to the energy reserve capacitor $C_{ER}$ or which may generate noise or inject substrate currents and thus disturbing a precise operation of the amplifier unit 10.

As in the embodiment of FIG. 1 the control of the switches, the processing of the digital measurement values provided by the ADC and the calculations necessary for determining the effective series resistance $R_{ESR}$ from the digital measurement values are performed by a control unit, e.g., a micro controller.

Another embodiment of the measurement method therefore includes:

(A) Deactivating switching converters 40 connected to the energy reserve capacitor $C_{ER}$ for a first time period. This time period has to include the measurement time $t_M$ in order to avoid noise and distortions caused by the switching during the effective series resistance measurement.

(B) Amplifying the energy reserve capacitor voltage $V_{ER}$ with an AC coupled amplifier unit 20, an output of the amplifier unit 20 being connected to a hold capacitor $C_{HOLD}$ via a switch $SW_2$ that is closed during amplifying. The hold capacitor $C_{HOLD}$ is thus charged via the amplifier output up to a hold capacitor voltage equal to the amplifier output voltage.

(C) Opening the switch $SW_2$ after a settling time $t_S$ of the amplifier unit 20, thus storing the amplified energy reserve capacitor voltage in the hold capacitor as a first measuring value.

(D) Digitizing the first measurement value yielding a first digital measurement value $V_1$.

(E) Activating a current source Q connected to the energy reserve capacitor $C_{ER}$ thus discharging the energy reserve capacitor $C_{ER}$ with a constant current I and causing a voltage swing $\Delta V_{ER}$ of the energy reserve capacitor voltage $V_{ER}$ due to a voltage drop across the effective series resistance $R_{ER}$.

(F) closing the switch $SW_2$ thus coupling the hold capacitor $C_{HOLD}$ to the output of the amplifier unit 20.

(G) Deactivating switching converters connected to the energy reserve capacitor $C_{ER}$ for a second time period. This time period also has to include the measurement time $t_M$.

(H) Amplifying the energy reserve capacitor voltage $V_{ER}$ with the AC coupled amplifier unit 20.

(I) Deactivating the current source Q. The discharging of the energy reserve capacitor $C_{ER}$ is thus stopped.

(J) Opening the switch $SW_2$ after a settling time $t_S$ of the amplifier unit 20 thus storing the amplified energy reserve capacitor voltage in the hold capacitor $C_{ER}$ as a second measuring value.

(K) Digitizing the second measurement value yielding a second digital measurement value $V_2$.

(L) Calculating the effective series resistance $R_{ER}$ of the energy reserve capacitor from the first and the second digital measurement value.

Activating the current source Q and closing the switch $SW_2$ may be done simultaneously as well as deactivating the current source Q and opening the switch $SW_2$. The effective series resistance $R_{ER}$ may be calculated from the difference $V_2-V_1$ of the second digital measurement value $V_2$ and the first digital measurement value $V_1$ in order to compensate for offsets. The first measurement value $V_1$ is equal to the bias reference voltage $V_{REF}$ and the second measurement value $V_2$ depends on the voltage swing $\Delta V_{ER} = -R_{ESR} \cdot I$ of the energy reserve capacitor voltage:

$$V_1 = V_{REF} \qquad (2)$$

$$V_2 = V_{REF} - R_{ESR} \cdot I \cdot F_{CORR}, \qquad (3)$$

wherein the factor $F_{CORR}$ is an exemplary correction factor due to parasitic capacitors as explained below.

The effective series resistance $R_{ESR}$ may be calculated for the measurement circuit arrangements of FIG. 1 and FIG. 2 according to the equation $$R_{ESR} = V_{OUT}/(G \cdot I \cdot F_{CORR}). \qquad (4)$$

$$V_{OUT} = G \cdot (V_1 - V_2) \qquad (5)$$

Where symbol G represents the gain of the amplifier unit 10 and VOUT the output voltage of the amplifier unit 10. The factor $F_{CORR}$ is introduced to consider parasitic capacitances, that couple the common circuit node of the coupling capacitor $C_{AC}$ and operational amplifier $OA_1$ (cf FIG. 2) to ground potential GND. The parasitic capacitance $C_{PAR}$ (not shown) and the coupling capacitor $C_{AC}$ may together form a capacitive voltage divider thus introducing an error. This error is taken into account by the term $F_{CORR} = C_{AC}/(C_{AC} + C_{PAR}) = 0.9357$ in the present embodiment.

The timing of the effective series resistance measurement is explained below with reference to FIG. 3

Figure 3:
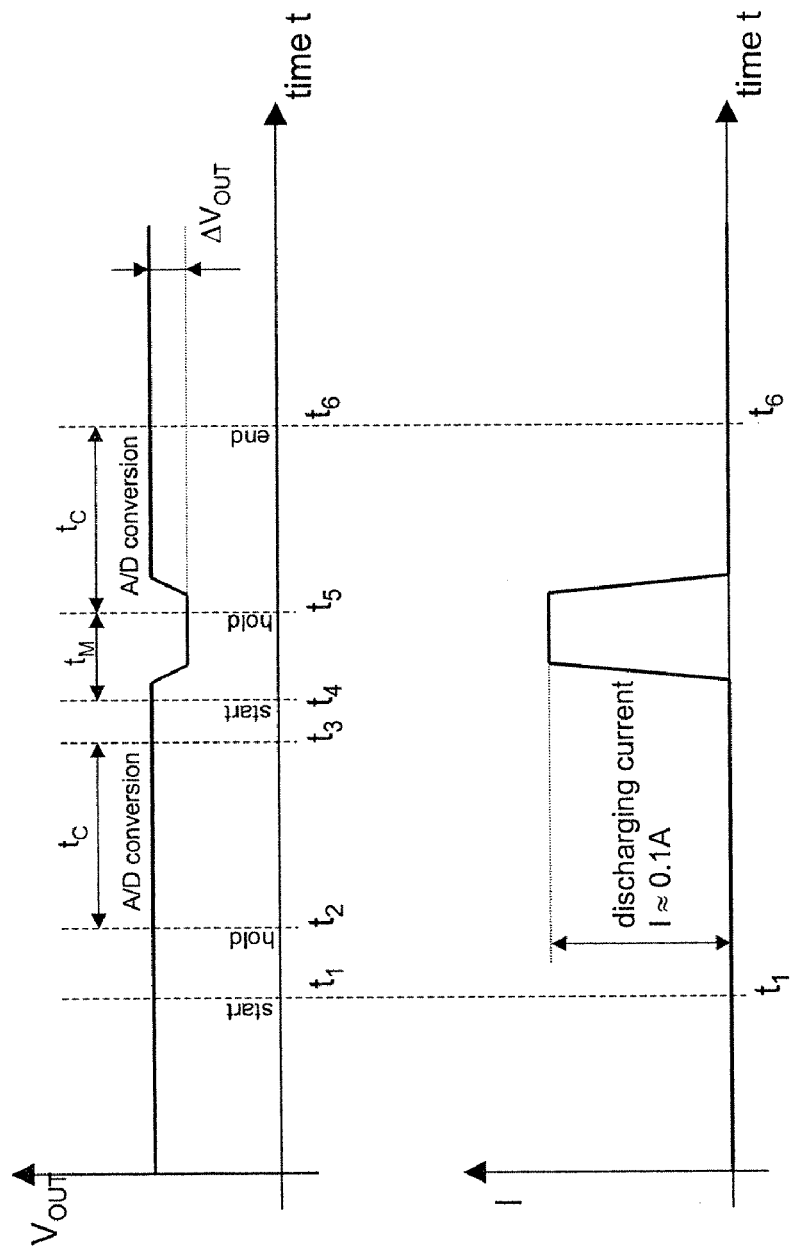
FIG. 3 illustrates the function of the circuit arrangements of FIGS. 1 and 2 by using timing diagrams of the relevant signals.

The first diagram of FIG. 3 is a timing diagram of the output voltage $V_{OUT}$ of the amplifier unit 20. The second diagram of FIG. 3 is a timing diagram of the current I discharging the energy reserve capacitor $C_{ER}$. The effective series resistance measurement starts at a time $t_1$, for example after the control unit has received a respective command to measure the effective series resistance $R_{ESR}$. At the time $t_1$ the switching converter 40 is deactivated for a given first time period. The switch $SW_2$ is also closed at time $t_1$, thus connecting the hold capacitor $C_{HOLD}$ to the output of the amplifier unit 20.

At time $t_2$ switch $SW_2$ is opened and the actual value of the output voltage $V_{OUT}(t_2)$ is stored in the hold capacitor $C_{HOLD}$ for the subsequent analogue-to-digital conversion. The time span $t_2-t_1$ has to be at least equal to or longer than the settling time $t_S$ of the AC coupled amplifier unit 20. The analogue-to-digital conversion may start immediately after time $t_2$ and is completed at a time $t_3$. The conversion time $t_C = t_3-t_2$ may range from 0.5 ms to 1 ms, whereas the setting time $t_S$ of the amplifier unit 20 is in the range of a few microseconds.

At time $t_4$ the switching converter 40 is again deactivated for a given second time period and switch $SW_2$ is closed again. Also at time $t_4$ the current source Q is activated and after a short delay the discharging current I reaches its nominal value of, for example, 0.1 A. As a consequence, the output voltage $V_{OUT}$ of the amplifier unit 10 drops by a voltage $\Delta V_{OUT} = G \cdot R_{ESR} \cdot I \cdot 0.9357 \cdot A_{ESR\_C}$ due to the voltage drop across the effective series resistance $R_{ESR}$, whereby G is the gain of the amplifier unit 10. At a time $t_5$ the switch $SW_2$ is again opened in order to hold the actual output value $V_{OUT}(t_5)$ of the amplifier unit 10. The time span $t_M = t_5-t_4$ is the measurement time which at least includes the settling time $t_S$ of the amplifier circuit and the delay time that the current source Q needs to ramp up the current I to its nominal value. At time $t_5$ the analogue-to-digital conversion of the stored measurement value starts. The conversion is completed after the conversion time $t_C$ has elapsed at time $t_6$. After time $t_6$ the effective series resistance may be calculated according to eq. (4), for example, by a microprocessor core in the control unit.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for measuring the effective series resistance of a capacitor having a capacitor voltage, the method comprising:
    amplifying the capacitor voltage, prior to discharging, with an AC coupled amplifier yielding a first amplified signal representative substantially of offsets present in the AC coupled amplifier;
    storing a first measurement value output by the amplifier in a hold capacitor, the voltage across the hold capacitor representing the first measurement value;
    discharging the capacitor with a constant current for a measurement time substantially equal to a settling time associated with switching in of a current source providing the constant
    current thus causing a voltage swing of the capacitor voltage due substantially to a voltage drop across the effective series resistance;
    amplifying the capacitor voltage with the AC coupled amplifier yielding a second amplified signal being representative substantially of the voltage swing and the offsets;
    storing the second measurement value output by the amplifier in a hold capacitor, the voltage across the hold capacitor representing the second measurement value; and
    calculating the effective series resistance from the first and the second amplified signals, wherein subtracting the first measurement value from the second measurement value yields a difference proportional to the voltage drop across the effective series resistance of the capacitor.

2. The method of claim 1 further comprising: digitizing the first and the second measuring value by an analog-to-digital converter connected to the hold capacitor.

3. The method of claim 1, further comprising:
    deactivating all switching converters connected to the capacitor for a given time period.

4. The method of claim 1, where the AC coupled amplifier comprises an input and an output, the input being connected to the capacitor via a coupling capacitance and the output being connected to the hold capacitor via a switching element.

5. The method of claim 4, comprising charging the hold capacitor via the amplifier output during the measurement time.

6. A method for measuring the effective series resistance of an energy reserve capacitor having an energy reserve capacitor voltage, the method comprising:

deactivating switching converters connected to the energy reserve capacitor for a first time period;

amplifying the energy reserve capacitor voltage with an AC coupled amplifier, an output of the amplifier being connected to a hold capacitor via a first switch that is closed during amplifying;

opening the first switch after a settling time of the amplifier thus storing the amplified energy reserve capacitor voltage in the hold capacitor as a first measuring value representative substantially of offsets in the AC coupled amplifier;

digitizing the first measurement value;

activating a current source connected to the energy reserve capacitor thus discharging the energy reserve capacitor with a constant current and reducing the energy reserve capacitor voltage due to a voltage drop across the effective series resistance;

closing the first switch thus connecting the hold capacitor to the amplifier output;

deactivating switching converters connected to the energy reserve capacitor for a second time period;

amplifying the energy reserve capacitor voltage with the AC coupled amplifier;

deactivating the current source;

opening the first switch after a settling time of the amplifier thus storing the amplified energy reserve capacitor voltage in the hold capacitor as a second measuring value representative of the voltage drop across the effective series resistance and offsets in the AC coupled amplifier;

digitizing the second measurement value; and calculating the effective series resistance of the energy reserve capacitor from the first and the second digitized measurement value.

7. The method of claim 6, where activating the current source and closing the first switch is done simultaneously and where deactivating the current source and opening the first switch is done simultaneously.

8. The method of claim 6, where the calculating of the effective series resistance comprises:

subtracting the first measurement value from the second measurement value yielding a difference proportional to the voltage drop on the effective series resistance of the capacitor.

9. The method of claim 8, comprising performing the calculating by a micro processor core.

10. The method of claim 6, comprising wherein the energy reserve capacitor voltage is greater than 20 volts.

11. A circuit arrangement that measures the effective series resistance of an energy reserve capacitor having an energy reserve capacitor voltage, the circuit arrangement comprising:

an energy reserve capacitor having an effective series resistance;

an amplifier having an amplifier input and an amplifier output, the amplifier input being coupled to the energy reserve capacitor via a coupling capacitor for amplifying an AC portion of the energy reserve capacitor voltage;

a sample and hold circuit comprising a hold capacitor coupled to the amplifier output via a first switch;

a switchable current source coupled to the energy reserve capacitor to discharge the energy reserve capacitor when active;

an analog-to-digital converter coupled to the hold capacitor to digitize the voltage of the hold capacitor; and a control unit that triggers the sample and hold circuit, the current source, and the analog-to-digital converter such that a first sample of the amplified AC portion of the energy reserve capacitor voltage is acquired while the current source is inactive and a second sample of the amplified AC portion of the energy reserve capacitor voltage is acquired while the current source is active, and wherein the control unit is further configured to calculate the effective series resistance from the first and the second acquired sample of the amplified AC portion of the energy reserve capacitor voltage.

12. The circuit arrangement of claim 11, further comprising at least one switching converter connected to the energy reserve capacitor, where the switching converter is deactivated during the acquisition of samples of the amplified AC portion of the energy reserve capacitor voltage.

13. An integrated circuit for measuring the effective series resistance of a capacitor under test having a capacitor voltage, the circuit comprising:

an AC coupled amplifier that amplifies the capacitor voltage of the capacitor under test;

a hold capacitor that stores an output voltage of the AC coupled amplifier resulting from the said capacitor voltage input to the amplifier;

a switchable constant current source;

a sample and hold circuit that samples a first and second stored output voltage of the hold capacitor as a first and second measurement value;

an analog-to-digital converter coupled to the hold capacitor to digitize the voltage of the hold capacitor; and a control unit that triggers the sample and hold circuit, the current source, and the analog-to-digital converter such that a first sample of the amplified AC portion of the capacitor voltage of the capacitor under test is acquired while the current source is inactive and a second sample of the amplified AC portion of the capacitor voltage of the capacitor under test is acquired while the current source is active.

14. A system for measuring the effective series resistance of a capacitor having a capacitor voltage, the system comprising:

means for amplifying the capacitor voltage with an AC coupled amplifier yielding a first amplified signal;

means for discharging the capacitor with a constant current for a measurement time thus causing a voltage swing of the capacitor voltage due to a voltage drop across the effective series resistance, and amplifying the capacitor voltage with the AC coupled amplifier yielding a second amplified signal being dependent on the voltage swing; and means for storing the voltage levels of the first amplified signal and the second amplified signal as first and second measurement values;

means for calculating the effective series resistance from the stored first and the second amplified signal.

15. The system of claim 14, where the calculating of the effective series resistance comprises:

subtracting the first measurement value from the second measurement value yielding a difference proportional to the voltage drop on the effective series resistance of the capacitor.

16. The system of claim 14, further comprising:

means for deactivating all switching converters connected to the capacitor for a given time period.

* * * * *